United States Patent
Gaume et al.

(10) Patent No.: US 10,546,966 B2
(45) Date of Patent: Jan. 28, 2020

(54) LIGHTWEIGHT PHOTOVOLTAIC MODULE INCLUDING A FRONT LAYER MADE FROM GLASS OR POLYMER AND A REAR LAYER COMPRISING RAISED PORTIONS

(71) Applicants: COMMISSARIAT A L'ENERGIE ATOMIQUE ET AUX ENERGIES ALTERNATIVES, Paris (FR); EDF ENR PWT, Paris la defense (FR)

(72) Inventors: Julien Gaume, Vezeronce-Curtin (FR); Paul Lefillastre, Paris (FR); Gilles Goaer, Bourgoin-Jallieu (FR); Nam Le Quang, Bourgoin-Jallieu (FR); Samuel Williatte, Bourgoin-Jallieu (FR)

(73) Assignees: COMMISSARIAT A L'ENERGIE ATOMIQUE ET AUX ENERGIES ALTERNATIVES, Paris (FR); EDF ENR PWT, Paris la defense (FR)

( * ) Notice: Subject to any disclaimer, the term of this patent is extended or adjusted under 35 U.S.C. 154(b) by 0 days.

(21) Appl. No.: 15/775,870

(22) PCT Filed: Nov. 14, 2016

(86) PCT No.: PCT/EP2016/077594
§ 371 (c)(1),
(2) Date: May 14, 2018

(87) PCT Pub. No.: WO2017/085021
PCT Pub. Date: May 26, 2017

(65) Prior Publication Data
US 2018/0331241 A1    Nov. 15, 2018

(30) Foreign Application Priority Data
Nov. 16, 2015 (FR) ...................... 15 60986

(51) Int. Cl.
*H01L 31/049* (2014.01)
*B32B 7/12* (2006.01)
(Continued)

(52) U.S. Cl.
CPC .............. *H01L 31/049* (2014.12); *B32B 7/12* (2013.01); *B32B 27/08* (2013.01); *B32B 37/06* (2013.01);
(Continued)

(58) Field of Classification Search
CPC ..................................................... H01L 31/049
See application file for complete search history.

(56) References Cited

U.S. PATENT DOCUMENTS

| 2005/0000561 A1* | 1/2005 | Baret | .................... H01L 31/048 136/244 |
| 2005/0178428 A1 | 8/2005 | Laaly et al. | |

(Continued)

FOREIGN PATENT DOCUMENTS

| EP | 2404321 | 1/2014 |
| EP | 2702613 | 3/2014 |

(Continued)

OTHER PUBLICATIONS

International Search Report dated Feb. 6, 2017, in PCT/EP2016/077594, filed Nov. 14, 2016.

(Continued)

*Primary Examiner* — Eli S Mekhlin
(74) *Attorney, Agent, or Firm* — Oblon, McClelland, Maier & Neustadt, L.L.P.

(57) ABSTRACT

A lightweight photovoltaic module including: a first transparent layer forming the front face; photovoltaic cells; an assembly encapsulating the photovoltaic cells; and a second layer forming the rear face and containing an inner surface and an outer surface. The encapsulating assembly and the (Continued)

photovoltaic cells are located between the first and second layers. The module is characterized in that: the first layer is made from glass and/or polymer material and has a thickness that is less than or equal to 1.1 mm; the inner surface is substantially planar; and the second layer includes raised portions projecting from the outer surface, the outer surface and raised portions together defining the visible rear outer surface of the photovoltaic module.

17 Claims, 5 Drawing Sheets

(51) Int. Cl.
  *B32B 27/08* (2006.01)
  *B32B 37/06* (2006.01)
  *B32B 37/12* (2006.01)
  *H01L 31/048* (2014.01)

(52) U.S. Cl.
  CPC .......... *B32B 37/12* (2013.01); *H01L 31/0481* (2013.01); *B32B 2457/12* (2013.01)

(56) References Cited

U.S. PATENT DOCUMENTS

| 2007/0074755 | A1* | 4/2007 | Eberspacher ..... H01L 31/02008 136/244 |
|---|---|---|---|
| 2011/0017275 | A1 | 1/2011 | Zhou et al. |
| 2012/0067393 | A1* | 3/2012 | Higashidate .............. B32B 7/12 136/244 |
| 2012/0174967 | A1 | 7/2012 | Pearce et al. |
| 2012/0199176 | A1 | 8/2012 | Hong et al. |

FOREIGN PATENT DOCUMENTS

| EP | 2724841 A1 | 4/2014 |
|---|---|---|
| FR | 2955051 A1 | 7/2011 |
| WO | WO 2008/019229 A2 | 2/2008 |
| WO | WO 2008/139975 A1 | 11/2008 |
| WO | WO 2010/019829 A1 | 2/2010 |
| WO | WO 2012/140585 A1 | 10/2012 |
| WO | WO 2013/024738 A1 | 2/2013 |
| WO | WO 2014/075919 A1 | 5/2014 |

OTHER PUBLICATIONS

French Search Report dated Jul. 20, 2016, in FR 1560986, filed Nov. 16, 2015.

* cited by examiner

LIGHTWEIGHT PHOTOVOLTAIC MODULE INCLUDING A FRONT LAYER MADE FROM GLASS OR POLYMER AND A REAR LAYER COMPRISING RAISED PORTIONS

TECHNICAL DOMAIN

This invention relates to the domain of photovoltaic modules that comprise a set of photovoltaic cells electrically connected to each other, and preferably "crystalline" photovoltaic cells, in other words based on monocrystalline silicon or multicrystalline silicon.

The invention can be used for many applications, and is particularly concerned by applications that require the use of lightweight photovoltaic modules, particularly with a weight less than or equal to 7 kg/m$^2$, particularly less than or equal to 6 kg/m$^2$, or even 5 kg/m$^2$, and with mechanical strength properties respecting standards IEC 61215 and IEC 61730. It can thus be applied particularly for buildings such as residences or industrial premises (tertiary, commercial, etc.), for example for construction of their roofs, for the design of urban furniture, for example for public lighting, road signs or for recharging electric cars, or even also for use for nomad applications particularly for integration on cars, buses, boats, etc.

The invention thus discloses a photovoltaic module comprising a first layer forming the front face of the module made of glass and/or a polymer material, and a second layer forming the rear face of the module, comprising raised portions on its outer surface, and a method of manufacturing such a photovoltaic module.

STATE OF PRIOR ART

A photovoltaic module is an assembly of photovoltaic cells arranged side by side between a first transparent layer forming a front face of the photovoltaic module and a second layer forming a rear face of the photovoltaic module.

The first layer forming the front face of the photovoltaic module is advantageously transparent so that the photovoltaic cells can receive a light flux. It is traditionally made from a single glass pane typically between 2 and 4 mm thick, and classically of the order of 3 mm thick.

The second layer forming the rear face of the photovoltaic module can be made based on glass, metal or plastic, among other materials. It is often composed of a polymer structure based on an electrically insulating polymer, for example of the polyethylene terephthalate (PET) or polyamide (PA) type, that can be protected by one or more layers based on fluorinated polymers, such as polyvinyl fluoride (PVF) or polyvinylidene fluoride (PVDF), and with a thickness of the order of 400 μm.

The photovoltaic cells can be electrically connected to each other by front and rear electrical contact elements called connecting conductors, formed for example from tinned copper strips in contact with the front face (facing the front face of the photovoltaic module that will receive a light flux) and the rear face (facing the rear face of the photovoltaic module) of each photovoltaic cell.

Furthermore, the photovoltaic cells located between the first and second layers forming the front and rear faces respectively of the photovoltaic module, can be encapsulated. Conventionally, the chosen encapsulating agent is an elastomer type polymer (or rubber), and for example can consist of using two poly(ethylene vinyl acetate) (EVA) layers (or films) between which the photovoltaic cells and cell connection conductors are located. Each encapsulating layer can be at least 0.2 mm thick and have a Young's modulus typically between 2 and 400 MPa at ambient temperature.

Thus, a conventional example of a photovoltaic module 1 comprising crystalline photovoltaic cells 4 is shown partially and diagrammatically on FIG. 1 and in an exploded view on FIG. 2.

As mentioned above, the photovoltaic module 1 comprises a front face 2, usually made from transparent toughened glass about 3 mm thick, and a rear face 5, for example composed of an opaque or transparent single-layer or multiple-layer sheet, with a Young's modulus of more than 400 MPa at ambient temperature.

Photovoltaic cells 4 are located between the front face 2 and the rear face 5 of the photovoltaic module 1 and are electrically connected together by connecting conductors 6 embedded between two layers, the front layer 3a and the rear layer 3b of the encapsulation material both of which form an encapsulating assembly 3.

Furthermore, FIGS. 1 and 2 also show the junction box 7 of the photovoltaic module 1, that will contain the wiring necessary for use of the module. Classically, this junction box 7 is made from plastic or rubber, and it provides a complete seal.

Normally, the method of manufacturing the photovoltaic module 1 comprises a step called vacuum lamination of the different layers described above, at a temperature greater than or equal to 120° C., or even 140° C., or even better 150° C., and less than or equal to 170° C., typically between 145 and 160° C., and during a lamination cycle lasting at least 10 minutes, or even 15 minutes.

During this lamination step, the layers of encapsulation material 3a and 3b melt and surround the photovoltaic cells 4, and at the same time adhesion is developed at all interfaces between layers, namely between the front face 2 and the front layer of the encapsulation material 3a, the layer of encapsulation material 3a and the front faces 4a of the photovoltaic cells 4, the rear faces 4b of the photovoltaic cells 4 and the rear layer of the encapsulation material 3b, and the rear layer of the encapsulation material 3b and the rear face 5 of the photovoltaic material 1. The photovoltaic module 1 obtained is then surrounded, typically by an aluminium section.

Such a structure is held in front of a standard that has a high mechanical strength due to the use of a front face 2 made of thick glass, that in most cases enables it to satisfy standards IEC 61215 and IEC 61730.

Nevertheless, such a photovoltaic module 1 according to the classical design known in prior art has the disadvantage that it is heavy, and in particular its weight per unit area is about 12 kg/m$^2$, and thus it is not suitable for some applications for which lightweight is a priority.

This heavy weight of the photovoltaic module is principally due to the presence of thick glass with a thickness of about 3 mm, to form the front face 2, the density of glass being high, about 2.5 kg/m$^2$/mm of thickness. The glass is strengthened to be able to resist stresses during fabrication and also for safety reasons, for example due to the risk of cutting. However, the industrial infrastructure of thermal strengthening is configured to treat glass not less than 3 mm thick. Furthermore, the choice of having glass with a thickness of about 3 mm is closely related to the mechanical strength at a normalised pressure of 5.4 kPa. In fact, glass alone thus accounts for almost 70% of the weight of the photovoltaic module 1, and glass plus the aluminium frame around the photovoltaic module 1 accounts for more than 80%.

There is also a need to find an alternative solution to the use of approximately 3 mm thick glass on the front face of the module, to obtain a significant reduction in the weight of a photovoltaic module so that it can be used in context of demanding new applications with strict weight requirements.

To achieve this, solutions have been proposed in the patent literature to develop other types of flexible and lightweight photovoltaic modules without a metal frame, starting from cells based on a GIGS (copper, indium, gallium and selenide) alloy or based on a thin layer silicide, replacing glass on the front face by lighter weight and thinner polymer materials. Thus, for example there is patent application FR 2 955 051 A1, American patent application US 2005/0178428 A1 and international applications WO 2008/019229 A2 and WO 2012/140585 A1.

The photovoltaic modules obtained have a much lower weight per unit area than photovoltaic modules classically made with thick glass on the front face. However, their mechanical properties are not good enough to resist stresses, particularly mechanical stresses, imposed particularly by standard IEC 61215.

Other solutions according to prior art apply to the use of thin glass on the front face of the photovoltaic module. This thin glass can be applied to the photovoltaic module provided that that is has previously been "hardened" using the chemical strengthening process. It is then possible to easily obtain a significant weight saving. Information on this subject can be found in international patents WO 2010/019829 A1, WO 2013/024738 A1 and WO 2008/139975 A1, and in European patent application EP 2 404 321 A1.

However, simply replacing thick glass with a thickness of about 3 mm by thin glass on the front face of the photovoltaic module degrades the mechanical strength properties of the module so that it no longer has a structure capable of resisting stresses, particularly mechanical stresses, imposed particularly by standard IEC 61215.

Some solutions for overcoming this problem include reinforcing the rear face of the photovoltaic module fitted with a metal frame, by means of metal cross-pieces to prevent it from bending when a mechanical load is applied to it. For example, reference can be made to European patent EP 2 702 613 A1.

Nevertheless, although these solutions can reduce the weight of the photovoltaic module while respecting imposed standards on mechanical properties, they require a major reinforcement to the frame and the weight per unit area of this type of photovoltaic module remains higher than 7 kg/m$^2$ when the thickness of the glass used is greater than or equal to 1.1 mm.

PRESENTATION OF THE INVENTION

There is thus a need to design an alternative solution of the photovoltaic module designed to be sufficiently lightweight to adapt to some applications while having mechanical properties such that it can comply with standards IEC 61215 and IEC 61730.

The purpose of the invention is to at least partially remedy the needs mentioned above and the disadvantages of embodiments according to prior art.

Thus the purpose of one aspect of the invention is a photovoltaic module comprising:
 a first transparent layer forming the front face of the photovoltaic module that will receive a light flux,
 a plurality of photovoltaic cells arranged side by side and electrically connected together,
 an assembly encapsulating the plurality of photovoltaic cells,
 a second layer forming the rear face of the photovoltaic module, the second layer comprising an inner surface in contact with the encapsulating assembly, and an outer surface opposite the inner surface, the encapsulating assembly and the plurality of photovoltaic cells being located between the first and the second layers, characterised in that the first layer is made of glass and/or at least one polymer material and its thickness is less than or equal to 1.1 mm,
 in that the inner surface of the second layer is approximately plane,
 and in that the second layer also comprises raised portions above the outer surface of the second layer, the outer surface and the raised portions together defining the visible outer rear surface of the photovoltaic module.

Thus, advantageously, the principle of the invention consists of replacing standard thick glass with a thickness of about 3 mm normally used in a classical photovoltaic module with a thinner glass layer and/or at least one polymer material, and modifying the rear face of the photovoltaic module to include the presence of a three-dimensional structure comprising raised portions projecting from the outer surface of the second layer of the photovoltaic module. In other words, the outer surface of the rear face of the photovoltaic module is three-dimensional, unlike the two-dimensional outer surfaces of photovoltaic modules according to prior art.

As will be explained below by means of preferred embodiments of the invention, the second layer of the photovoltaic module can be formed in one or several parts, namely it can consist of a single monolayer or multilayer comprising said raised portions or in an assembly comprising at least two layers, one of which comprises said raised portions, each of said at least two layers being monolayer or multilayer, and the combination of which forms the second layer. In particular, the second layer in the form of a single part, may consist of a three-dimensional reinforcement placed in contact with the encapsulating assembly, while the second layer in the form of several parts may consist of a single monolayer or multilayer layer similar to a layer forming the rear face of a photovoltaic module according to the classical design of prior art, and a second layer in the form of a three-dimensional stiffener.

The term "transparent" means that the material of the first layer forming the front face of the photovoltaic module is at least partially transparent to visible light, allowing at least about 80% of this light to pass through.

Furthermore, the term "encapsulating" or "encapsulated" means that the plurality of photovoltaic cells is located inside a volume, for example hermetically sealed against liquids, at least partly formed by at least two layers of encapsulating material, connected to each other after lamination to form the encapsulating assembly.

Initially, in other words before any lamination operation, the encapsulating assembly is composed of at least two layers of encapsulation material, called core layers, between which the plurality of photovoltaic cells is located. However, during the layer lamination operation, the layers of encapsulation material melt so that, after the lamination activity, only a single solidified layer (or assembly) is formed, in which the photovoltaic cells are embedded.

The invention thus makes it possible to obtain a new type of rigid photovoltaic module with a weight substantially less than the weight of a classical photovoltaic module like that described above, particularly in practice half the weight of a classical module, namely a weight of less than or equal to 7 kg/m², or even 6 kg/m², or even 5 kg/m², compared with about 12 kg/m² for a classical module. Furthermore, the photovoltaic module proposed by the invention retains mechanical properties equivalent to the properties of traditional photovoltaic modules using thick glass about 3 mm thick on the front face.

The photovoltaic module according to the invention can also comprise one or several of the following characteristics that may be taken in isolation or in any possible technical combination.

Thus, the first layer may be made of glass, and particularly hardened glass, with or without raised portions.

The first layer may also be made from at least one polymer material, for example with or without raised portions, and particularly chosen from among polycarbonate (PC), polymethyl methacrylate (PMMA), particularly monophase (non-impact) PMMA or multi-phase (impact) PMMA, for example nanostructured impact PMMA, like that marketed by the Altuglas Company® under the brand Altuglas® Shield-Up®, polyethylene terephthalate (PET), polyamide (PA), a fluorinated polymer and particularly polyvinyl fluoride (PVF) or polyvinylidene fluoride (PVDF), ethylene tetrafluoroethylene (ETFE), ethylene chlorotrifluoroethylene (ECTFE), polytetrafluoroethylene (PTFE) and/or polychlorotrifluoroethylene (PCTFE).

According to a first embodiment of the invention, the second layer may be composed of an assembly of at least one first rear layer in contact with the encapsulating assembly and a second three-dimensional rear layer such that the first rear layer is placed between the encapsulating assembly and the second rear layer, the inner surface of the second layer being formed by the inner surface, in contact with the encapsulating assembly, the first rear layer and the outer surface of the second layer being formed by the outer surface of the second rear layer, that comprises raised portions projecting from said outer surface.

The second layer may also comprise an adhesive layer between the first rear layer and the second rear layer, to assemble the second rear layer to the first rear layer.

"Adhesive layer" means a layer that, after the assembly composed of the first layer, the encapsulating assembly, the photovoltaic cells and the first rear layer has been made, enables the second rear layer to bond to the first rear layer. The result obtained is thus a layer that enables chemical compatibility and adhesion between the first rear layer and the second rear layer. In particular, the adhesive layer may especially be a silicone glue. The adhesive layer may also be an adhesive sensitive to pressure, also called PSA (Pressure Sensitive Adhesive). The PSA is composed of an elastomer base with a sticky thermoplastic resin with low molecular mass, for example an ester. The elastomer base may for example be an acrylic, a rubber (butyl, natural or silicone), a nitrile, a styrene block copolymer (SBC) (for example, styrene-butadiene-styrene (SBS), styrene-ethylene/butylene-styrene (SEBS), styrene-ethylene/propylene (SEP), styrene-isoprene-styrene (SIS)) or a vinyl ether. The elastomer base may also be made of Ethylene Vinyl Acetate (EVA), with a high content of vinyl acetate.

Moreover, the first rear layer may be a mono or multilayer polymer.

Preferably, the first rear layer comprises a Tedlar®/polyethylene terephthalate (PET)/Tedlar® (TPT) rear layer. The first rear layer may also comprise a polymer film based on a polymer film based on polyolefins, particularly a coextruded multilayer film based on polypropylene (PP), polyamide (PA) and polyethylene (PE), for example a film in the Reflexolar® range marketed by the Renolit company. The first rear layer may also comprise a polymer film based on polyamide grafted polyolefins, for example a film obtained from the Jurasol BS1 range marketed by the Juraplast company.

In general, the first rear layer can also be made like the rear layer of a photovoltaic module with a classical design, namely based on glass, metal or plastic, among other materials. It may for example by formed from a polymer structure based on an electrically insulating polymer, for example of the polyethylene terephthalate (PET), polyamide (PA) or polypropylene (PP) type, that can be protected by one or more layers based on fluorinated polymers, such as polyvinyl fluoride (PVF) or polyvinylidene fluoride (PVDF).

Furthermore, the thickness of the first rear layer may be between 150 and 600 µm, and particularly of the order of 400 µm.

Advantageously, the first rear layer comprises an inner surface in contact with the substantially plane encapsulating assembly, and an outer surface in contact with the second approximately plane rear layer.

The second rear layer may preferably be made from at least one composite material, particularly of the polymer/glass fibre type, for example epoxy resin/glass fibre.

Advantageously, the second rear layer thus forms a mechanical stiffener fixed to the first rear layer. In other words, it forms a part that provides mechanical strength for the photovoltaic model Preferably, the dimensions of the second rear layer are at least equal to the dimensions of the first rear layer of the photovoltaic module.

Furthermore, the second rear layer may preferably comprise raised portions on its outer surface, said raised portions being formed by recesses made on the inner surface of the second rear layer.

Thus, the second rear layer may have a vertical dimension on its outer surface, originating from the presence or raised portions, while this vertical dimension may be non-existent on its inner surface, since the hollow portions do not project from this inner surface. Advantageously, such recesses may be at least partially filled by the adhesive layer located between the first rear layer and the second rear layer.

Furthermore, the second rear layer may comprise a plurality of attachment points, that will fix the photovoltaic module to support cross-pieces to form a panel of photovoltaic modules configured to enable a separation of said support cross-pieces for example between 735 and 1045 mm.

Furthermore, according to a second embodiment of the invention, the second layer may be composed of a single three-dimensional rear layer in contact with the encapsulating assembly, the inner surface of said three-dimensional rear layer being approximately plane and the outer surface of said three-dimensional rear layer forming portions raised above said outer surface.

The three-dimensional rear layer may preferably be made from at least one composite material, particularly of the polyamide/glass fibre or epoxy resin/glass fibre type.

Advantageously, the three-dimensional rear layer forms a mechanical stiffener fixed to the encapsulating assembly. In other words, it forms a part that provides mechanical strength for the photovoltaic model Furthermore, the weight per unit area of the photovoltaic module is preferably less than or equal to 7 kg/m², particularly less than or equal to 6 kg/m², and more particularly less than or equal to 5 kg/m². Preferably, such a photovoltaic module comprises for example about sixty crystalline silicon photovoltaic cells with dimensions 156 mm×156 mm. However the invention is not limited to a fixed number of cells and can be applied to modules with more or less cells.

Furthermore, the weight per unit area of each of the second rear layer and the three-dimensional rear layer described above can be less than or equal to 2 kg/m$^2$, particularly less than or equal to 1.8 kg/m$^2$, and more particularly less than or equal to 1.5 kg/m$^2$.

In particular, the weight per unit area of the second rear layer can be less than or equal to less than or equal to the weight per unit area of the three-dimensional rear layer.

The raised portions of the outer surface of the second layer may advantageously be in the form of elongated ribs.

The thickness of the elongated ribs may be between 5 and 60 mm, better between 20 and 60 mm, and even more preferably between 35 and 55 mm.

According to one embodiment of the invention, the elongated ribs comprise so-called principal elongated ribs and so-called secondary elongated ribs, the thickness of the secondary ribs being less than the thickness of the principal ribs.

In this case, the thickness of the principal ribs may be between 20 and 60 mm, and preferably between 35 and 55 mm.

The thickness of the secondary ribs may also be between 5 and 20 mm, better between 5 and 10 mm.

Furthermore, according to one embodiment of the invention, at least part of the elongated ribs and particularly the principal ribs is located on the periphery of the outer surface of the second layer so as to form at least a partial peripheral frame of the outer surface of the second layer.

Such a peripheral frame can preferably be partial so as to leave a space without any elongated ribs for integration of a junction box, to contain the wiring necessary for use of the photovoltaic module.

Furthermore, according to one embodiment of the invention, at least a first elongated rib, particular a first principal elongated rib, extends from a first corner of the periphery of the outer surface of the second layer and at least one second elongated rib, particularly a second principal elongated rib, extends from a second corner of the periphery of the outer surface of the second layer, the first and second corners in particular being successive corners around the periphery of the outer surface of the second layer, said at least one first elongated rib and a second elongated rib extending towards each other so as to intersect at least at one intersection point. Advantageously, said at least one intersection point is advantageously located on an axis passing through at least two attachment points that will be used to fix the photovoltaic module to support cross pieces to form a panel of photovoltaic modules, particularly around the periphery of the outer surface of the second layer, facing each other.

Furthermore, the encapsulating assembly may be made from at least one polymer material chosen from among acid copolymers, ionomers, poly(ethylene vinyl acetate) (EVA), vinyl acetals such as polyvinylbutyrals (PVB), polyurethanes, polyvinyl chlorides, polyethylenes such as low density linear polyethylenes, polyolefin elastomer copolymers, copolymers of α-olefins and α-, β-carboxylic acids to ethylinic esters, such as ethylene methyl acrylate copolymers and ethylene butyl acrylate copolymers, silicone elastomers and/or epoxy resins, among others.

Preferably, the encapsulating assembly can be made from two layers of poly(ethylene vinyl acetate) (EVA) with a thickness equal to at least 200 μm, between which the photovoltaic cells are arranged.

The photovoltaic cells can be chosen from among homojunction or heterojunction photovoltaic cells based on monocrystalline silicon (c-Si) and/or multi-crystalline silicon (mc-Si), and/or photovoltaic cells comprising at least one material from among amorphous silicon (a-Si), microcrystalline silicon (μC-Si), cadmium telluride (CdTe), copper indium selenide (CIS) and copper indium gallium diselenide (CIGS), among others.

Furthermore, the photovoltaic cells may be between 1 and 300 μm thick.

The photovoltaic module may also comprise a junction box in which the wiring necessary for operation of the photovoltaic module can be installed.

Furthermore, when the first layer forming the front face of the photovoltaic module is transparent, the second layer forming the rear face of the photovoltaic module may or may not be transparent, and in particular may be opaque.

Furthermore, the space between two nearby, or consecutive or adjacent photovoltaic cells, can be greater than or equal to 1 mm, particularly between 1 and 30 mm, and preferably equal to 3 mm.

Moreover, another purpose of another aspect of the invention is a method of making a photovoltaic module as defined above, characterised in that it comprises the step for hot lamination of at least some of the layers forming the photovoltaic module at a temperature equal to or more than 120° C. for a lamination cycle time of at least 10 minutes.

According to a first variant, the method may be used for manufacturing of a photovoltaic module according to the first embodiment of the invention described above, and may then include the following two successive steps:

a) hot lamination of the assembly formed by the first layer, the encapsulating assembly, the photovoltaic cells and the first rear layer at a temperature greater than or equal to 120° C. for a lamination cycle duration equal to at least 10 minutes, to obtain a photovoltaic laminate.

b) assembly of the second rear layer on said photovoltaic laminate, particularly on the first rear layer, making use of an adhesive layer.

According to a second variant, the method can also be used to manufacture a photovoltaic module according to the second embodiment of the invention described above, and may then comprise the single hot lamination step of the assembly formed by the first layer, the encapsulating layer, the photovoltaic cells and the second layer, at a temperature greater than or equal to 120° C. for a lamination cycle time of at least 10 minutes, Furthermore, the method can then use a backing mould in contact with the outer surface of the second layer with geometry inverse to the relief formed by the raised portions on the outer surface of the second layer, during this single lamination step.

The backing mould may be made from at least one metallic material, particularly aluminium and/or steel.

The photovoltaic module and the manufacturing method according to the invention may comprise any one of the previously described characteristics, taken in isolation or in any technically possible combination with other characteristics.

BRIEF DESCRIPTION OF THE DRAWINGS

The invention will be better understood after reading the following detailed description of non-limitative example embodiments of the invention, and an examination of the diagrammatic and partial figures in the appended drawing on which.

Furthermore, the different parts shown on the figures are not necessarily all at the same scale, to make the figures more easily understandable.

DETAILED PRESENTATION OF PARTICULAR EMBODIMENTS

Figure 1:
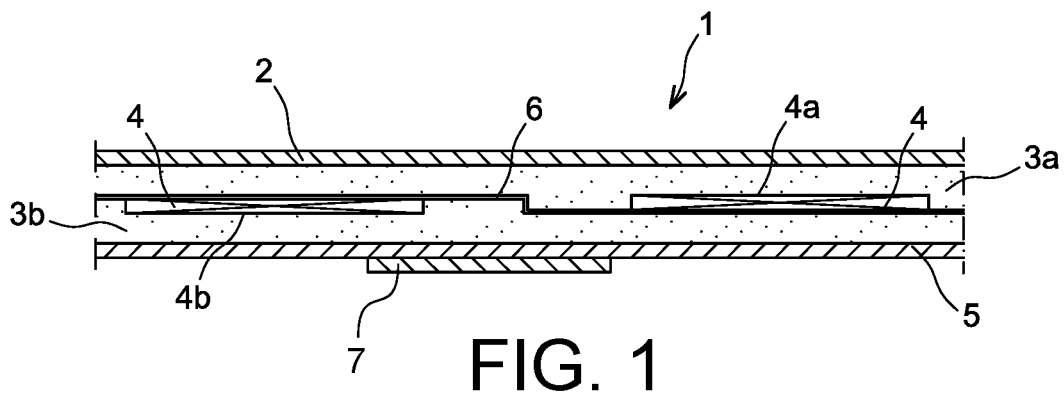
FIG. 1 shows a sectional view of a classical example of a photovoltaic module containing crystalline photovoltaic cells.
Figure 2:
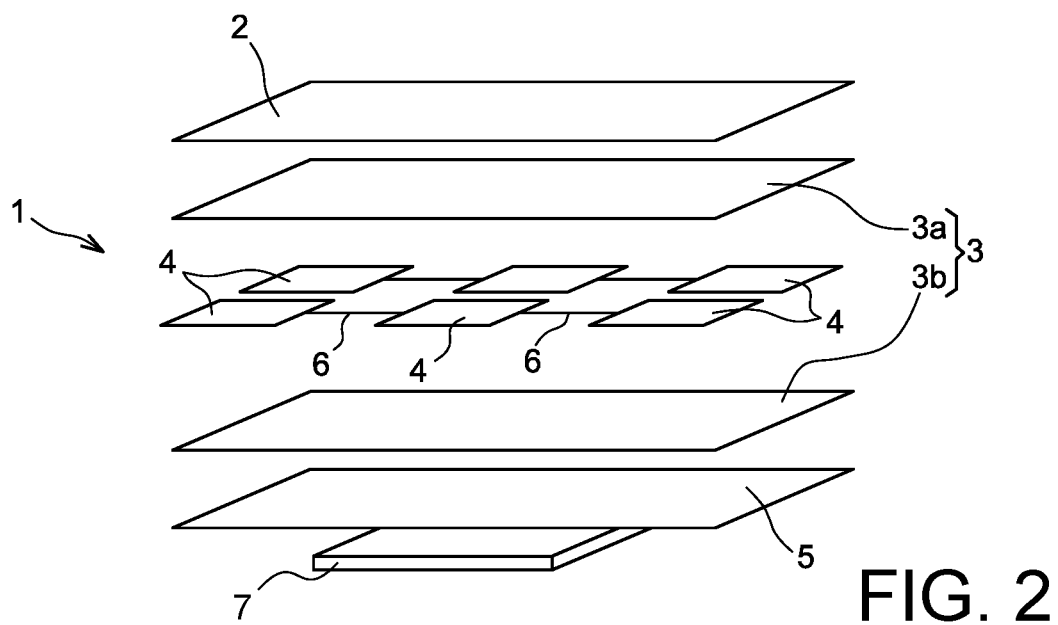
FIG. 2 shows an exploded view of the photovoltaic module in FIG. 1.

FIGS. 1 and 2 have already been described in the part dealing with the state of prior art.

FIGS. 3, 4A, 4B and 5A to 5D refer to a first embodiment of the invention, while FIGS. 6, 7, 8A and 8B refer to a second embodiment of the invention.

For each of these two embodiments, it is considered that the photovoltaic cells 4, interconnected by soldered tinned copper ribbons, are "crystalline" cells, in other words they are based on mono or multicrystalline silicon and that their thickness is between 1 and 300 µm.

Furthermore, the encapsulating assembly 3 is chosen to be made from two poly(ethylene vinyl acetate) (EVA) layers between which the photovoltaic cells 4 are located, each layer having a minimum thickness of 300 µm, or even 200 µm. As a variant, this encapsulating assembly 3 may also be a thermoplastic elastomer as described above.

Moreover, although not shown on FIGS. 3 to 8B, each photovoltaic module 1 may comprise a junction box similar to the junction box 7 shown on FIGS. 1 and 2 that will contain the wiring necessary for operation of the photovoltaic module 1. This junction box can be made of plastic or rubber, and it is completely leak tight.

The photovoltaic cells 4, the encapsulating assembly 3 and the junction box 7 form so-called "incompressible" elements in the composition of the photovoltaic module 1. Their combined weight per unit area is about 1.5 kg/m².

Advantageously, the invention includes a specific choice for materials forming the front and rear faces of the photovoltaic module 1, so as to obtain a lightweight photovoltaic module 1 with a weight per unit area of less than or equal to 7 kg/m², and preferably less than or equal to 6 kg/m², or even 5 kg/m². In particular, the invention makes it possible to eliminate the thick glass layer with a thickness of about 3 mm on the front face and to eliminate the metal frame of the photovoltaic module that normally accounts for about 80% of the total weight of a photovoltaic module.

Thus, in the two embodiments described below, the first layer 2 forming the front face of the photovoltaic module is a layer of glass with thickness e2 less than or equal to 1.1 mm, previously "hardened" using the chemical strengthening process.

Obviously, these choices are in no way limitative as was described above.

First Embodiment

Figure 3:
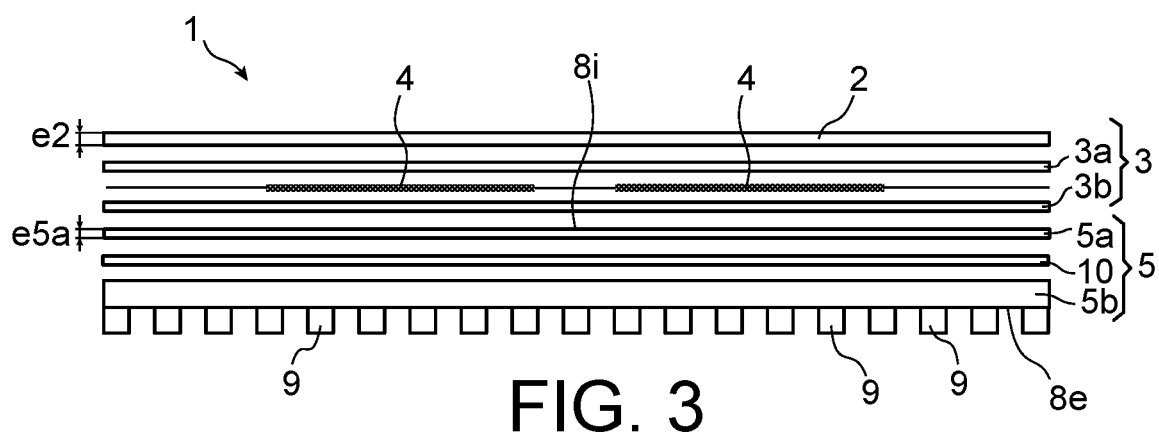
FIG. 3 is a sectional exploded view of a first example embodiment of a photovoltaic module according to the invention.

Refer firstly to FIG. 3 that is a sectional exploded view of a first example embodiment illustrating a photovoltaic module 1 according to the invention, Note that FIG. 3 corresponds to an exploded view of the photovoltaic module 1 before the lamination steps in the first example of the method according to the invention, subsequently described with reference to FIGS. 5A to 5D. Once the lamination has been done to achieve hot vacuum pressing, the different layers are actually superposed on each other.

The photovoltaic module 1 thus comprises a first transparent layer 2 made of thin glass less than or equal to 1.1 mm thick, forming the front face of the photovoltaic module 1 and that will receive a light flux, a plurality of photovoltaic cells 4 located side by side and electrically connected to each other, and an assembly 3 encapsulating the plurality of photovoltaic cells 4.

According to the invention, the photovoltaic module 1 also comprises a second layer 5 forming the rear face of the photovoltaic module 1, this second layer 5 in this example being composed of an assembly of a first rear layer 5a, in contact with the encapsulating assembly 3, and a second three-dimensional rear layer 5b such that the first rear layer 5a is located between the encapsulating assembly 3 and the second rear layer 5b.

The inner surface 8i in contact with the encapsulating assembly 3 of the first rear layer 5a is approximately plane so that the first rear layer 5a can bond to the encapsulating assembly 3 during the lamination operation described below.

On the other hand, the outer surface 8e of the second rear layer 5b comprises raised portions 9 projecting from this outer surface 8e, the outer surface 8e and the raised portions 9 together defining the visible outer rear surface of the photovoltaic module 1. Thus, the outer surface 8e confers a three-dimensional structure or a three-dimensional reinforcement on the second rear layer 5b.

Furthermore, in order to make a bond possible between the first rear layer 5a and the second rear layer 5b forming a stiffener 3D, this assembly 5 forming the second layer comprises an adhesive layer 10 between the first rear layer 5a and the second rear layer 5b. Preferably, this adhesive layer 10 can be a silicone glue.

The first rear layer 5a can be made in a manner similar to the rear layer of a classical photovoltaic module 1. Preferably, the first rear layer 5a is chosen to be a mono- or multilayer polymer film, particularly of the Tedlar®/polyethylene terephthalate (PET)/Tedlar® type, also called TPT.

The thickness e5a of this first rear layer 5a may be between 150 and 600 μm, and particularly of the order of 400 μm.

Advantageously, the first rear layer 5a comprises an inner surface 8i, in contact with the substantially plane encapsulating assembly 3, and an outer surface in contact with the second approximately plane rear layer 5b.

Furthermore, the second rear layer 5b forming a 3D stiffener, is advantageously made from a composite material, and epoxy resin/glass fibre. This guarantees mechanical strength of the photovoltaic module 1.

The dimensions of the second rear layer 5b are advantageously at least equal to the dimensions of the first layer 2 of the photovoltaic module 1.

Figure 4A:
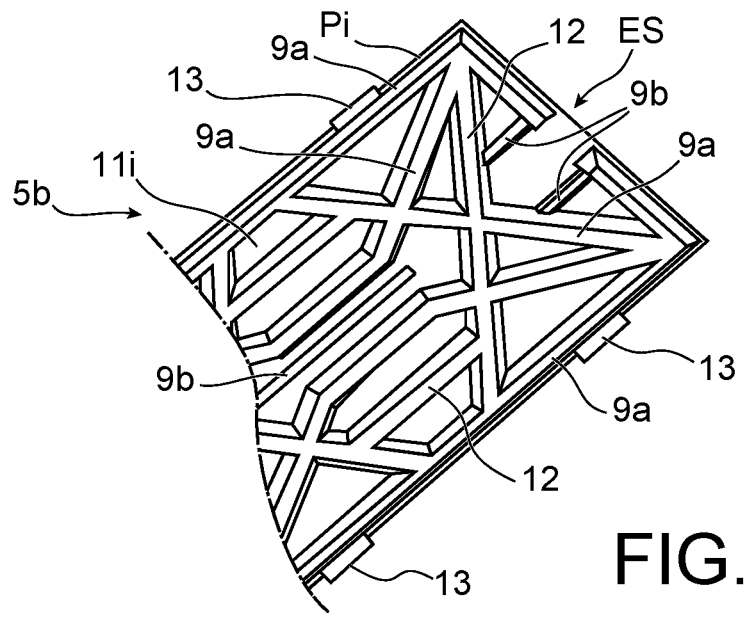
FIGS. 4A and 4B are front views partially representing the inner and outer surfaces respectively of the second rear layer of the photovoltaic module in FIG. 3, FIGS. 5A to 5D illustrate different steps in a first example of a method conforming with the invention for manufacturing a photovoltaic module similar to that shown in FIG. 3, in sectional and assembled views in FIGS. 5B and 5D, in an exploded view in FIG. 5A and a partially exploded view in FIG. 5C.
Figure 4B:
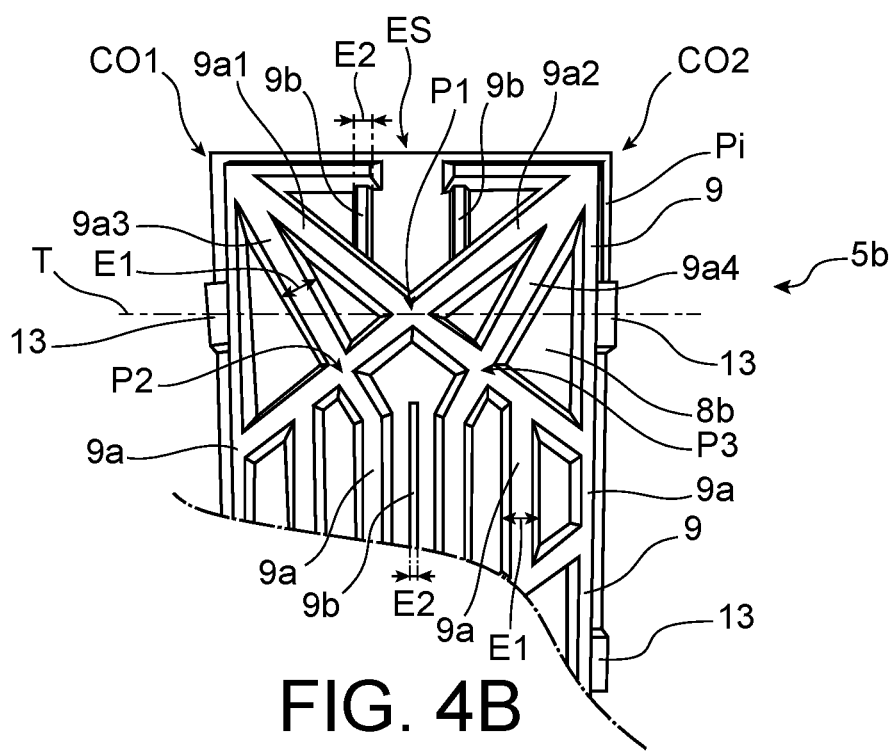

FIGS. 4A and 4B are front views partially representing the inner surface 11i and outer surface 8e respectively of the second rear layer 5b of the photovoltaic module 1 in FIG. 3.

As can be seen on these figures, the second rear layer 5b comprises raised portions 9 on its outer surface 8e, in the form of elongated ribs projecting from this outer surface 8e. These raised portions 9 are actually formed from complementary shaped recesses 12 made on the inner surface 11i of the second rear layer 5b. Thus, the second rear layer 5b has a vertical dimension on its outer surface 8e, due to the presence of projecting raised portions 9.

Also, in this first example embodiment, the 3D stiffener formed by the second rear layer 5b has a non-plane inner surface 11i and outer surface 8e.

Figure 7:
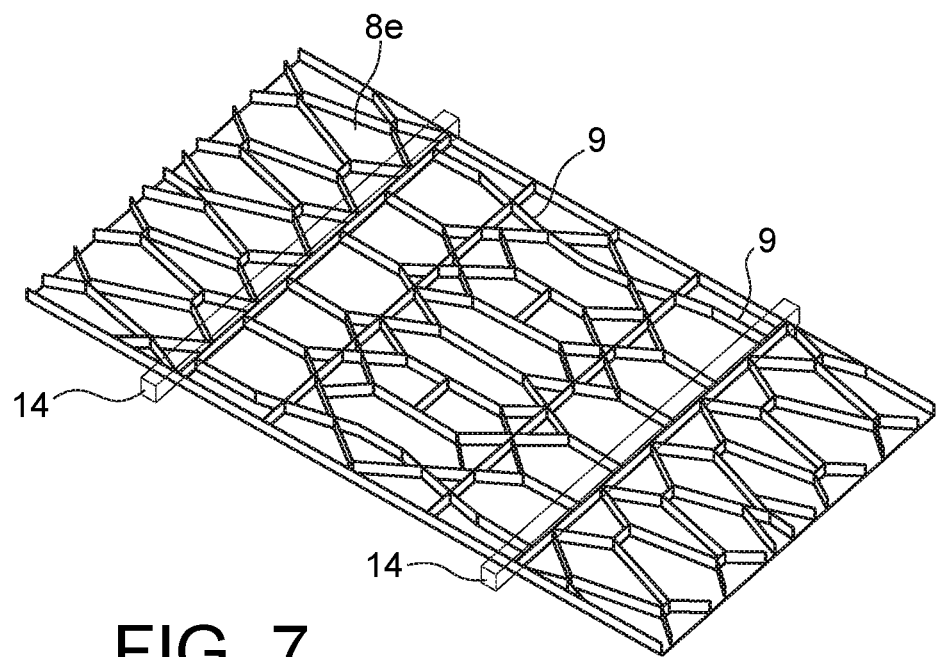
FIG. 7 shows a front view of the outer surface of the three-dimensional rear layer of the photovoltaic module in FIG. 6, representing support cross-pieces.

Furthermore, as can also be seen around the periphery of the inner surface and the outer surface 8e of the second rear layer 5b, it also comprises a plurality of attachment points 13 that will be used for attachment of the photovoltaic module 1 to support cross-pieces, like those 14 shown on FIG. 7 concerning the second embodiment to form a panel of photovoltaic modules 1, and configured to authorise a separation of said support cross-pieces, for example between 735 and 1045 mm.

In this example embodiment in FIGS. 4A and 4B, the elongated ribs 9 are in the form of two types of elongated ribs, namely firstly so-called principal elongated ribs 9a and secondly so-called secondary elongated ribs 9b.

Advantageously, as can be seen on FIG. 4B, the thickness E1 of the principal elongated ribs 9a is greater than the thickness E2 of the secondary elongated ribs 9b.

In particular, the thickness E1 of the principal longitudinal ribs 9a is between 20 and 60 mm, and preferably between 35 and 55 mm. The thickness E2 of the secondary elongated ribs 9b is between 5 and 20 mm, and preferably between 5 and 10 mm.

It should be noted that according to one variant of FIGS. 4A and 4B, the elongated ribs 9 can only comprise principal elongated ribs 9a and no secondary elongated ribs 9b.

Furthermore, as can be seen on FIGS. 4A and 4B, a part of the principal elongated ribs 9a is located on the periphery Pi of the outer surface 8e of the second rear layer 5b so as to form a peripheral frame for the second rear layer.

However, this peripheral frame is partial because it comprises a space ES, without an elongated rib 9, provided for the integration of a junction box 7 as shown on FIG. 2, that will contain the wiring necessary for use of the photovoltaic module 1.

Furthermore, in this example embodiment in FIGS. 4A and 4B, a first principal elongated rib 9a1 extends obliquely from a first corner CO1 of the periphery Pi of the outer surface 8e to the central portion of the outer surface 8e and a second principal elongated rib 9a2 extends obliquely from a second corner CO2 of the periphery Pi of the outer surface 8e to the central portion of the outer surface 8e. The first corner CO1 and the second corner CO2 are successive corners along the periphery Pi of the outer surface 8e.

Advantageously, these first 9a1 and second 9a2 principal elongated ribs extend crosswise and intersect each other at a first intersection point P1 located on an axis T connecting the attachment points 13 located on the two lateral edges of the outer surface 8e.

Furthermore, a third principal elongated rib 9a3 also extends obliquely from the first corner CO1 of the periphery Pi of the outer surface 8e to the central portion of the outer surface 8e and a fourth principal elongated rib 9a4 also extends obliquely from the second corner CO2 of the periphery Pi of the outer surface 8e to the central portion of the outer surface 8e.

Advantageously, these second 9a2 and third 9a3 principal elongated ribs extend crosswise and intersect each other at a second intersection point P2 located approximately on, in other words close to, the axis T connecting the attachment points 13 located on the two lateral edges of the outer surface 8e.

Also advantageously, these first 9a1 and fourth 9a4 principal elongated ribs extend crosswise and intersect each other at a third intersection point P3 located approximately on, in other words close to, the axis T connecting the attachment points 13 located on the two lateral edges of the outer surface 8e.

Figure 5A:
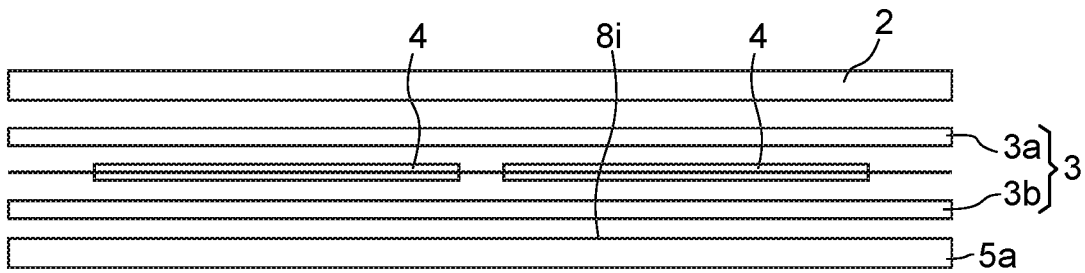
Figure 5B:
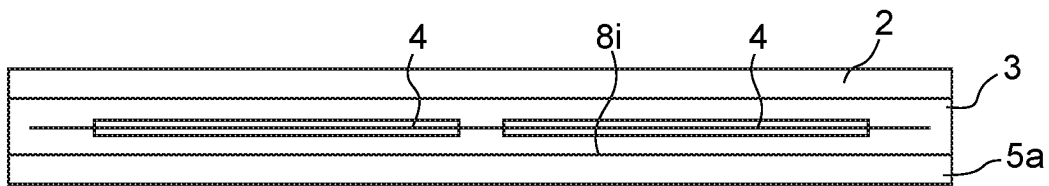
Figure 5C:
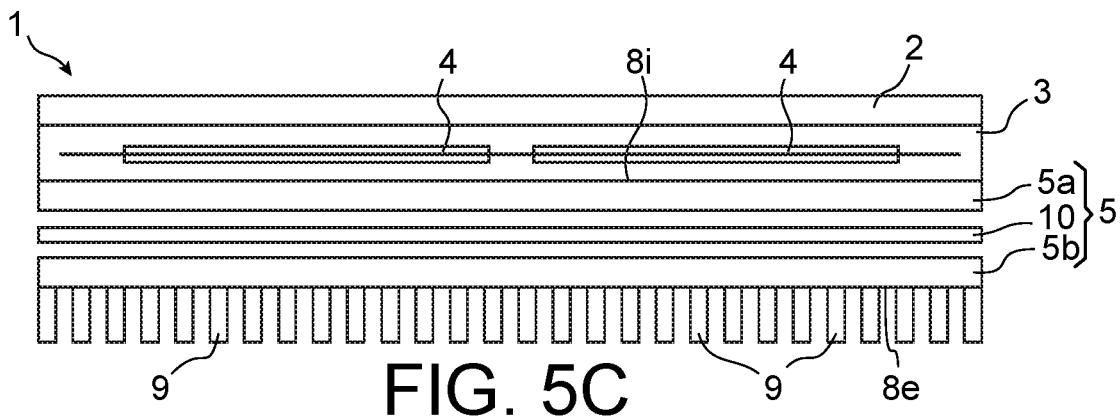
Figure 5D:
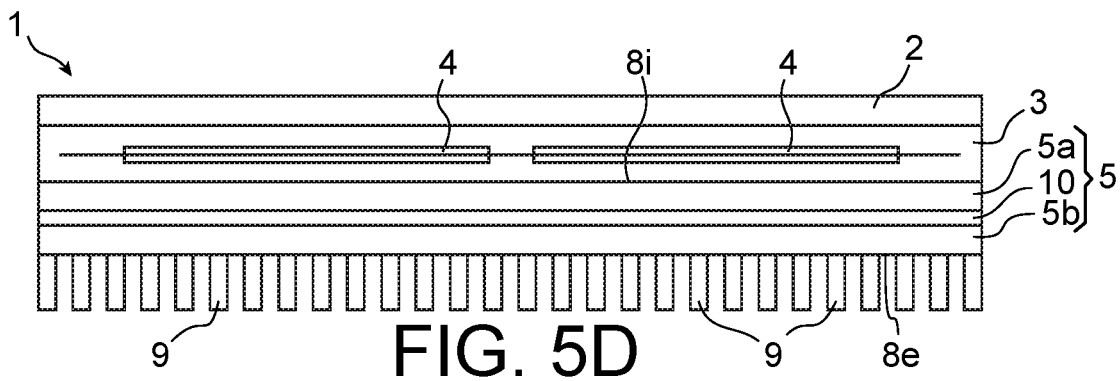

FIGS. 5A to 5D illustrate different steps in the first example method conforming with the invention for manufacturing a photovoltaic module 1 similar to that shown in FIG. 3, with sectional and assembled views in FIGS. 5B and 5D, in an exploded view in FIG. 5A and a partially exploded view in FIG. 5C, FIG. 5A is an exploded view illustrating a photovoltaic structure, before lamination, comprising the first layer 2, the encapsulating assembly 3 and the photovoltaic cells 4, and the first rear layer 5a.

On FIG. 5B, this same structure is represented after the photovoltaic laminate was obtained following a hot lamination step a), at a temperature greater than or equal to 120° C. and during a lamination cycle time of at least 10 minutes.

FIG. 5C illustrates the assembly step of the photovoltaic laminate in FIG. 5B by bonding the second rear layer 5b on the first rear layer 5a using the adhesive layer 10.

Finally, FIG. 5D illustrates the photovoltaic module 1 obtained conforming with the invention.

The photovoltaic module 1 has a weight per unit area of less than 7 kg/m². The deflection observed at the centre after a test at a pressure of 5400 Pa is less than 40 mm and does not exceed 25 mm.

Second Embodiment

Figure 6:
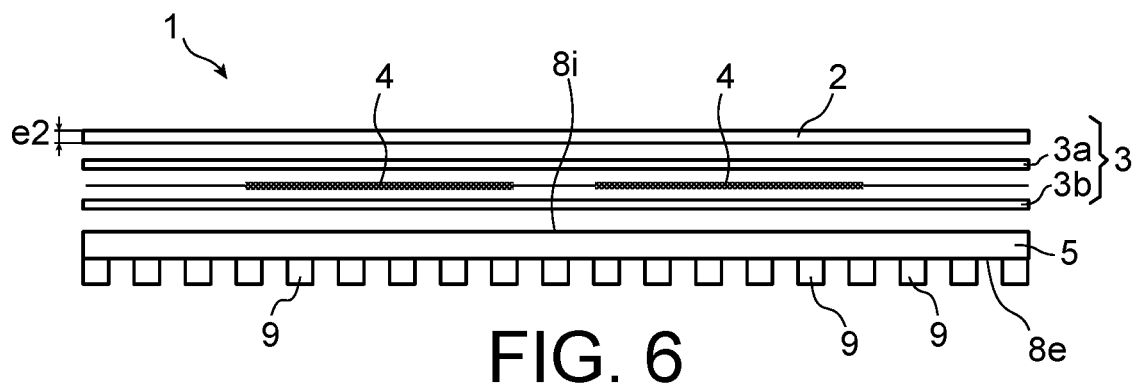
FIG. 6 is a sectional exploded view of a second example embodiment of a photovoltaic module according to the invention.

Refer now to FIG. 6 that is a sectional exploded view of a second example embodiment illustrating a photovoltaic module 1 according to the invention.

Note also that FIG. 6 corresponds to an exploded view of the photovoltaic module 1 before the lamination steps in the second example of the method according to the invention, described below with reference to FIGS. 8A and 8B. Once the lamination has been done to achieve hot vacuum pressing, the different layers are actually superposed on each other.

The photovoltaic module 1 thus comprises a first transparent layer 2 made of thin glass less than or equal to 1.1 mm thick, forming the front face of the photovoltaic module 1 and that will receive a light flux, a plurality of photovoltaic cells 4 located side by side and electrically connected to each other, and an assembly 3 encapsulating the plurality of photovoltaic cells 4.

In accordance with the invention, the photovoltaic module 1 also comprises a second layer 5 forming the rear face of the photovoltaic module 1, this second layer 5 in this example being composed of a single three-dimensional rear layer 5 in contact with the encapsulating assembly 3.

The inner surface 8i of this three-dimensional rear layer 5 is substantially plane so that it can bond to the encapsulating assembly 3 during the lamination operation, while the outer surface of the three-dimensional rear layer 5 comprises raised portions 9 forming a projection relative to this outer surface 8e.

FIG. 7 shows a front view of the outer surface 8e of the three-dimensional rear layer 5 of the photovoltaic module 1 in FIG. 6, also representing support cross-pieces 14 for attachment of the photovoltaic module 1 to a photovoltaic panel.

Advantageously, this three-dimensional rear layer 5 forms a 3D structure made of a composite material, particularly of the polyamide/glass fibre type. It guarantees mechanical strength of the photovoltaic module 1.

The outer surface 8e of this three-dimensional rear layer 5 and the raised portions 9 together define the visible rear outer surface of the photovoltaic module 1.

Unlike the second rear layer 5b in the first embodiment, represented on FIGS. 4A and 4B, the three-dimensional layer 5 of the second embodiment represented on FIG. 7, has an approximately plane inner surface and an outer surface 8e provided with raised portions 9. This is the reason why this layer can bond to the encapsulating assembly 3 directly during a lamination operation while the second rear layer 5b in the first embodiment cannot due to its inner surface that is not plane, which justifies the second bonding step with an adhesive layer 10.

Furthermore, as can be seen on FIG. 7, the three-dimensional rear layer 5 comprises raised portions 9 in the form of elongated ribs projecting from the outer surface 8e. Thus, the three-dimensional rear layer has a vertical dimension on its outer surface 8e, originating from the presence or raised portions 9, while this vertical dimension is non-existent on its substantially plane inner surface. As mentioned above, the thickness of the elongated ribs 9 may be as described above, and may possibly comprise so-called principal elongated ribs and so-called secondary elongated ribs, as described above.

Note that the general pattern formed by the raised portions 9 on the outer surface 8e of the three-dimensional rear layer 5 that can be seen on FIG. 7 could also be used as a general pattern formed by raised portions 9 on the outer surface 8e of the second rear layer, visible on FIG. 4B, and vice versa.

Figure 8A:
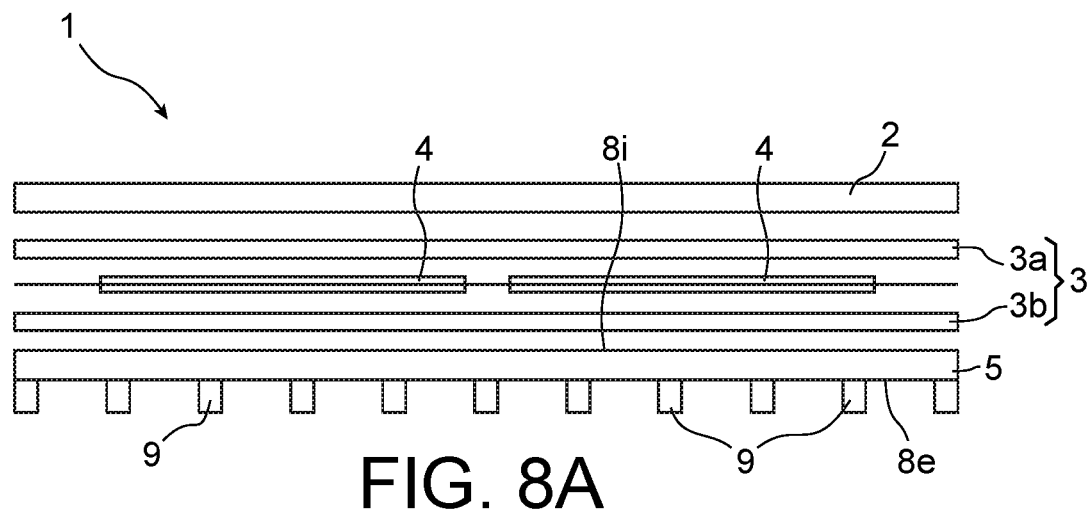
FIGS. 8A and 8B illustrate different steps in a second example of a method conforming with the invention for manufacturing a photovoltaic module similar to that shown in FIG. 6, in an exploded view in FIG. 8A and an assembled view in FIG. 8B, In all these figures, identical references may denote identical or similar elements.
Figure 8B:
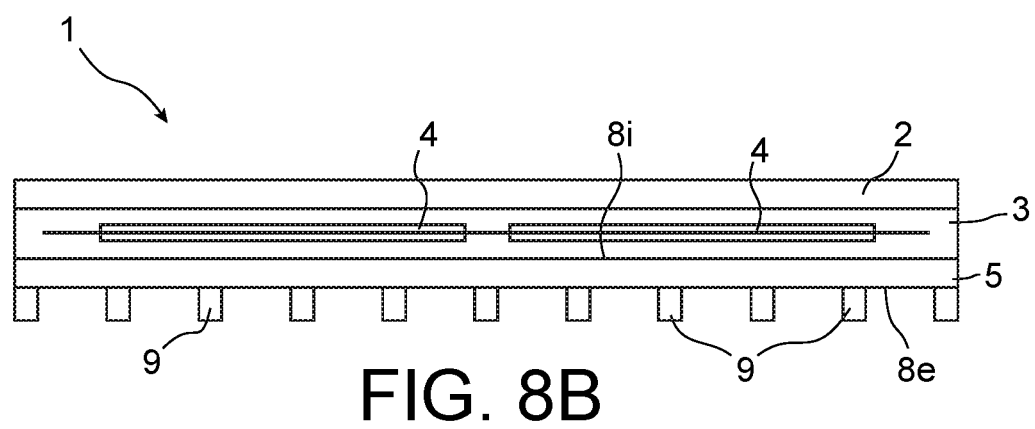

FIGS. 8A and 8B illustrate different steps in the second example method conforming with the invention for manufacturing a photovoltaic module 1 similar to that shown in FIG. 6, in an exploded view in FIG. 8A and an assembled view in FIG. 8B.

FIG. 8A is an exploded view illustrating a photovoltaic structure, before lamination, comprising the first layer 2, the encapsulating assembly 3 and the photovoltaic cells 4, and the three-dimensional rear layer 5.

On FIG. 8B, this same structure is represented after the single hot lamination step at a temperature greater than or equal to 120° C. for a lamination cycle duration equal to at least 10 minutes on this structure to obtain the photovoltaic module 1 according to the second embodiment-.

During this single lamination step, a backing mould is preferably used in contact with the outer surface 8e of the second layer 5 due to the fact that its outer surface 8e is not plane, since it contains raised portions 9. The geometry of this backing mould is the inverse of the geometry with raised portions 9 on the outer surface 8e of the three-dimensional rear layer 5. It thus matches the geometry of the stack of layers in the laminator. This backing mould is preferably a good thermal conductor, thus being made from a metallic material, for example aluminium and/or steel.

Furthermore, for both of the embodiments envisaged above, the weight per unit area of each of the second rear layer 5b and the three-dimensional rear layer 5 is preferably be less than or equal to 2 kg/m$^2$, particularly less than or equal to 1.8 kg/m$^2$, and more particularly less than or equal to 1.5 kg/m$^2$. The weight per unit area of the second rear layer 5b can be less than or equal to the weight per unit area of the three-dimensional rear layer 5.

Advantageously, due to the use of a front face made of glass with a thickness less than or equal to 1.1 mm or polymer, the weight per unit area of the photovoltaic module 1 may be less than or equal to 7 kg/m$^2$, preferably less than or equal to 6 kg/m$^2$ or even 5 kg/m$^2$, namely not more than half the weight per unit area of a classical photovoltaic module.

This significant weight saving makes it possible to install the photovoltaic module 1 according to the invention on applications for which a standard module weighing about 12 kg/m$^2$ could not be used.

Furthermore, due to the use of composite materials to make the second layer 5, and more precisely the second rear layer 5b and the three-dimensional rear layer 5, the photovoltaic module 1 according to the invention maintains its mechanical properties to resist stresses in standards IEC 61215 and IEC 61730.

The module obtained is also compatible with an industrial line for fabrication of standard photovoltaic modules.

Obviously, the invention is not limited to the example embodiments that have just been described. An expert in the subject can make various modifications to it.

The invention claimed is:

1. A photovoltaic module, comprising:
   a first layer, which is transparent and forms a front face of the photovoltaic module for receiving a light flux,
   a plurality of photovoltaic cells arranged side by side and electrically connected together,
   an encapsulating assembly encapsulating the plurality of photovoltaic cells, and
   a second layer, which forms a rear face of the photovoltaic module and comprises an inner surface in contact with the encapsulating assembly, an outer surface opposite to the inner surface, and raised portions in a form of elongated ribs above the outer surface,
   wherein
   the encapsulating assembly and the plurality of photovoltaic cells are located between the first layer and the second layer,
   the first layer is made of glass and/or at least one polymer material and has a thickness of less than or equal to 1.1 mm, the inner surface of the second layer is approximately planar, the outer surface and the raised portions of the second layer together define a visible outer rear surface of the photovoltaic module, at least one first elongated rib extends from a first corner of a periphery of the outer surface of the second layer and at least one second elongated rib extends from a second corner of the periphery of the outer surface of the second layer, the first corner and the second corner being successive corners around the periphery of the outer surface of the second layer, and the at least one first elongated rib and the at least one second elongated rib extend away from the respective successive corners at an acute angle so as to intersect at least at one intersection point.

2. The module according to claim 1, wherein the first layer is made of at least one polymer material selected from the group consisting of polycarbonate (PC), polymethyl methacrylate (PMMA), polyethylene terephthalate (PET), polyamide (PA), a fluorinated polymer, ethylene tetrafluoroethylene (ETFE), ethylene chlorotrifluoroethylene (ECTFE), polytetrafluoroethylene (PTFE), and polychlorotrifluoroethylene (PCTFE).

3. The module according to claim 1, wherein the second layer comprises an assembly of at least one first rear layer, a second rear layer that comprises the raised portions projecting from an outer surface thereof so that the second rear layer is three-dimensional, and an adhesive layer between the first rear layer and the second rear layer to assemble the second rear layer to the first rear layer, wherein the first rear layer is placed between the encapsulating assembly and the second rear layer and has an inner surface in contact with the encapsulating assembly, the inner surface of the second layer is formed by the inner surface of the first rear layer, and the outer surface of the second layer is formed by the outer surface of the second rear layer.

4. The module according to claim 3, wherein the first rear layer is a mono or multilayer polymer film, and/or the first rear layer has a thickness between 150 and 600 μm.

5. The module according to claim 3, wherein the second rear layer is made of at least one composite material.

6. The module according to claim 3, wherein the raised portions are formed by recesses made on an inner surface of the second rear layer.

7. The module according to claim 1, wherein the second layer comprises a single three-dimensional rear layer, which is in contact with the encapsulating assembly, and has an approximately planar inner surface and an outer surface having the raised portions.

8. The module according to claim 7, wherein the three-dimensional rear layer is made of at least one composite material.

9. The module according to claim 1, wherein a weight per unit area of the module is less than or equal to 7 kg/m$^2$.

10. The module according to claim 1, wherein a thickness of the elongated ribs is between 5 and 60 mm.

11. The module according to claim 1, wherein the elongated ribs comprise principal elongated ribs and secondary elongated ribs, and the principal elongated ribs are thicker than the secondary elongated ribs.

12. The module according to claim 11, wherein the principal elongated ribs has a thickness between 20 and 60 mm, and the secondary elongated ribs has a thickness between 5 and 20 mm.

13. The module according to claim 1, wherein at least part of the elongated ribs is located on the periphery of the outer surface of the second layer so as to form at least a partial peripheral frame of the outer surface of the second layer.

14. The module according to claim 13, wherein the peripheral frame is partial so as to leave a space without any elongated ribs for integration of a junction box, which contains a wiring necessary for use of the photovoltaic module.

15. A method for manufacturing a photovoltaic module, the method comprising:

assembling a photovoltaic module comprising a first layer, a plurality of photovoltaic cells encapsulated within an encapsulating assembly, and a second layer; and hot laminating at least some layers of the photovoltaic module at a temperature equal to or more than 120° C. for a lamination cycle time of at least 10 minutes, wherein the first layer forms a front face of the photovoltaic module, is transparent and made of glass and/or at least one polymer material, and has a thickness of less than or equal to 1.1 mm;

the photovoltaic cells are arranged side by side and electrically connected together;

the second layer forms a rear face of the photovoltaic module and comprises an approximately planar inner surface in contact with the encapsulating assembly, an outer surface opposite to the inner surface, and raised portions in a form of elongated ribs above the outer surface with the outer surface and the raised portions together defining a visible outer rear surface of the photovoltaic module;

the encapsulating assembly is located between the first and second layers;

at least one first elongated rib extends from a first corner of a periphery of the outer surface of the second layer and at least one second elongated rib extends from a second corner of the periphery of the outer surface of the second layer, the first corner and the second corner being successive corners around the periphery of the outer surface of the second layer; and the at least one first elongated rib and the at least one second elongated rib extend away from the respective successive corners at an acute angle so as to intersect at least at one intersection point.

16. The method according to claim 15, wherein the second layer comprises an assembly of at least one first rear layer, a second rear layer that comprises the raised portions projecting from an outer surface thereof so that the second rear layer is three-dimensional, and an adhesive layer between the first rear layer and the second rear layer to assemble the second rear layer to the first rear layer;

the first rear layer is placed between the encapsulating assembly and the second rear layer and has an inner surface in contact with the encapsulating assembly;

the inner surface of the second layer is formed by the inner surface of the first rear layer;

the outer surface of the second layer is formed by the outer surface of the second rear layer; and the method comprises:
- hot laminating the first layer, the encapsulating assembly, the photovoltaic cells, and the first rear layer at a temperature greater than or equal to 120° C. for a lamination cycle time of at least 10 minutes to obtain a photovoltaic laminate; and
- assembling the second rear layer to said photovoltaic laminate with the adhesive layer.

17. The method according to claim 15, wherein
said hot laminating comprises a single hot lamination of the first layer, the encapsulating layer, the photovoltaic cells, and the second layer at the temperature greater than or equal to 120° C. for the lamination cycle time of at least 10 minutes, and
a backing mould contacts the outer surface of the second layer with geometry inverse to the raised portions on the outer surface of the second layer during the single lamination.

* * * * *